United States Patent
Yang et al.

(10) Patent No.: US 8,043,925 B2
(45) Date of Patent: Oct. 25, 2011

(54) METHOD OF FORMING CAPACITOR OF SEMICONDUCTOR MEMORY DEVICE

(75) Inventors: Dong-kwan Yang, Yongin-si (KR); Seong-ho Kim, Seoul (KR); Won-mo Park, Seongnam-si (KR); Gil-sub Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 27 days.

(21) Appl. No.: 12/591,072

(22) Filed: Nov. 6, 2009

(65) Prior Publication Data

US 2010/0120212 A1 May 13, 2010

(30) Foreign Application Priority Data

Nov. 7, 2008 (KR) .................. 10-2008-0110494

(51) Int. Cl.
*H01L 21/20* (2006.01)

(52) U.S. Cl. .. 438/386; 438/243; 257/304; 257/E21.011

(58) Field of Classification Search .................. 438/239, 438/243, 386; 257/304, 305, 307, E21.011, 257/E21.014, E21.018, E21.646–E21.649
See application file for complete search history.

(56) References Cited

U.S. PATENT DOCUMENTS

| 6,853,023 | B2 | 2/2005 | Goebel et al. |
| 6,914,286 | B2 * | 7/2005 | Park ............................. 257/304 |
| 7,897,474 | B2 * | 3/2011 | Eto .............................. 438/396 |
| 2004/0115884 | A1 | 6/2004 | Wang |
| 2010/0200901 | A1 * | 8/2010 | Kim ............................. 257/306 |

FOREIGN PATENT DOCUMENTS

| KR | 10-2003-0019639 A | 3/2003 |
| KR | 10-2004-0001274 A | 1/2004 |
| KR | 10-2004-0008698 A | 1/2004 |

* cited by examiner

*Primary Examiner* — Matthew Landau
*Assistant Examiner* — Candice Chan
(74) *Attorney, Agent, or Firm* — Lee & Morse, P.C.

(57) ABSTRACT

A method of forming a semiconductor memory device includes sequentially forming an etch stop layer and then a mold layer, forming a plurality of line-shaped support structures and a first sacrificial layer filling gaps between the support structures on the mold layer, sequentially forming a plurality of line-shaped first mask patterns, a second sacrificial layer, and then second mask patterns on the support structures and on the first sacrificial layer, removing the second sacrificial layer, the first sacrificial layer, and the mold layer using the first mask patterns, the second mask patterns, and the support structures as masks, removing the first mask patterns and second mask patterns, filling the storage node electrode holes with a conductive material and etching back the conductive material to expose the support structures, and removing the first sacrificial layer and the mold layer to form pillar-type storage node electrodes supported by the support structures.

11 Claims, 15 Drawing Sheets

METHOD OF FORMING CAPACITOR OF SEMICONDUCTOR MEMORY DEVICE

BACKGROUND

1. Field

Embodiments relate to a method of forming a capacitor of a semiconductor memory device.

2. Description of the Related Art

As the capacity and integration density of semiconductor memory devices increase, not only the size of memory cells, but also an area occupied by a cell capacitor in a memory cell, sharply decreases. To maximize the capacitance of a cell capacitor in a memory cell with a limited small area, a three-dimensional structure, e.g., a cylindrical structure, may be adopted to increase an area of an electrode.

SUMMARY

Embodiments are directed to a method of forming a capacitor of a semiconductor memory device, which substantially overcomes one or more of the problems due to the limitations and disadvantages of the related art.

It is a feature of an embodiment to provide a method of forming a capacitor of a semiconductor device in which a high-capacitance capacitor is formed while reducing or eliminating increases in the aspect ratio of the capacitor.

At least one of the above and other features and advantages may be realized by providing a method of forming a semiconductor memory device, the method including forming an interlayer dielectric layer on a semiconductor substrate, forming storage node contacts that extend through the interlayer dielectric layer, sequentially forming an etch stop layer and then a mold layer on the interlayer dielectric layer, forming a plurality of line-shaped support structures and a first sacrificial layer filling gaps between the support structures on the mold layer, the support structures extending in a first direction, sequentially forming a plurality of line-shaped first mask patterns, a second sacrificial layer, and then second mask patterns on the support structures and on the first sacrificial layer, the first mask patterns extending in a second direction crossing the first direction, the second sacrificial layer covering the first mask patterns to a uniform thickness, and the second mask patterns being formed in trenches in the second sacrificial layer between adjacent ones of the first mask patterns, removing the second sacrificial layer, the first sacrificial layer, and the mold layer using the first mask patterns, the second mask patterns, and the support structures as masks to form storage node electrode holes that expose surfaces of the storage node contacts, removing the first mask patterns and second mask patterns to expose the support structures, filling the storage node electrode holes with a conductive material and etching back the conductive material to expose the support structures, and removing the first sacrificial layer and the mold layer to form pillar-type storage node electrodes supported by the support structures.

A portion of the second sacrificial layer may cover facing sidewalls of adjacent first mask patterns, and removing the second sacrificial layer, the first sacrificial layer, and the mold layer may form two storage node electrode holes that both expose a surface of a same storage node contact.

Each of the support structures may include a support pattern and a support mask pattern disposed on the support pattern, and removing the first and second mask patterns to expose the support structures may include removing the support mask pattern to expose the support pattern.

The first mask pattern may be formed of a material having an etch selectivity with respect to each of the support pattern, the first sacrificial layer, the second sacrificial layer, and the mold layer, and the second mask pattern may be formed of a material having an etch selectivity with respect to each of the support pattern, the first sacrificial layer, the second sacrificial layer, and the mold layer.

The support pattern may be formed of a material having an etch selectivity with respect to each of the first sacrificial layer, the second sacrificial layer, and the mold layer.

Forming the second mask patterns may include forming a second mask layer on the semiconductor substrate, the second mask layer filling the trenches in the second sacrificial layer, and removing the second mask layer and the second sacrificial layer until the first mask layer is exposed.

Forming the second mask patterns may include forming a second mask layer on the semiconductor substrate, the second mask layer filling the trenches in the second sacrificial layer, and removing the second mask layer until the second sacrificial layer is exposed.

The method may further include forming a transistor under the interlayer dielectric layer, the transistor having a gate electrode, a source region, and a drain region. The storage node contact may be formed to be electrically connected to one of the source region and the drain region of the transistor.

The method may further include forming a bit line under the interlayer dielectric layer and extending parallel to the support structures.

The method may further include sequentially forming a dielectric layer and then an upper electrode layer on the conductive material that fills the storage node electrode holes.

At least one of the above and other features and advantages may also be realized by providing a method of forming a memory device, the method including forming a transistor on a semiconductor substrate, the transistor including a source/drain region electrically coupled to an overlying storage structure via a contact, forming a first temporary layer covering the transistor, forming first and second patterns at a same level on the first temporary layer, the first and second patterns being spaced apart from one another on the first temporary layer, forming third and fourth patterns at a same level on the first and second patterns, the third and fourth patterns being spaced apart from one another and defining, in combination with the first and second patterns, an enclosed area above the contact, forming a fifth pattern that divides the enclosed area into two portions, forming a pair of storage node electrode holes in the divided enclosed area using an etch operation, the first through fifth patterns serving as etch masks during the etch operation, forming storage node electrodes in the pair storage node electrode holes, such that each storage node electrode is electrically connected to a same source/drain region of the transistor via the contact, and removing the temporary layer and the third, fourth, and fifth patterns so as to leave the first and second patterns in contact with upper portions of the storage node electrodes, the first and second patterns reinforcing the upper portions of the storage node electrodes.

BRIEF DESCRIPTION OF THE DRAWINGS

The above and other features and advantages will become more apparent to those of skill in the art by describing in detail example embodiments with reference to the attached drawings, in which:

FIGS. 2A through 12A illustrate perspective views of stages in a method of forming a capacitor of the semiconductor memory device according to the first embodiment shown in FIG. 1;

FIGS. 2B through 12B illustrate cross-sectional views (taken in directions I-I and II-II) of FIGS. 2A through 12A, respectively;

DETAILED DESCRIPTION

Figure 1:
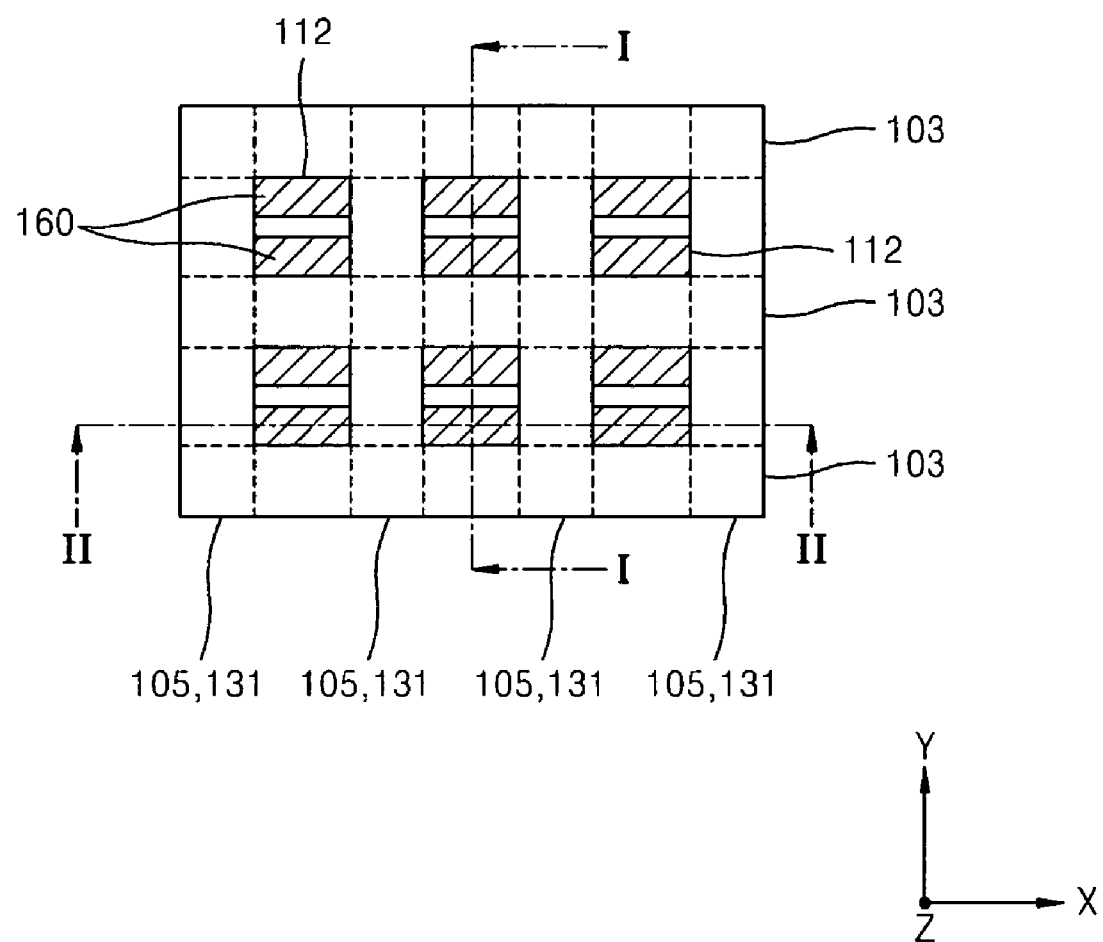
FIG. 1 illustrates a plan view of a semiconductor memory device according to a first embodiment.

Korean Patent Application No. 10-2008-0110494, filed on Nov. 7, 2008, in the Korean Intellectual Property Office, and entitled: "Method of Forming Capacitor of Semiconductor Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 12A:
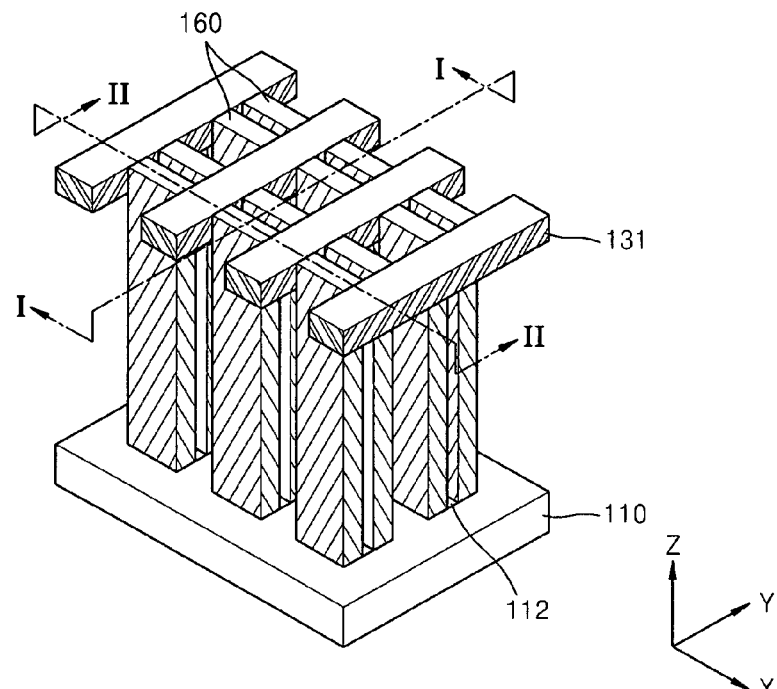

FIG. 1 illustrates a plan view of a semiconductor memory device according to a first embodiment, and FIG. 12A illustrates a partial perspective view of the semiconductor memory device of FIG. 1.

Referring to FIGS. 1 and 12A, two storage node electrodes 160 may be separately formed on a single storage node contact 112. As shown in FIG. 1, the storage node contacts 112 may be interposed between word lines 103 and bit lines 105. The word lines 103 may extend in a first direction, e.g., parallel to the X-axis, and the bit lines 105 may extend in a second direction, e.g., parallel to the Y-axis.

As shown in FIGS. 1 and 12A, support patterns 131 may be provided between pairs of storage node electrodes 160 in order to support the storage node electrodes 160. As shown in FIG. 1, the support patterns 131 may be formed in the same positions as the bit lines 105. The support patterns 131 may extend parallel to the Y-axis and may be separated from one another, i.e., spaced apart, in the X-axis direction.

FIGS. 2A through 12A illustrate perspective views of stages in a method of forming a capacitor of the semiconductor memory device according to the first embodiment shown in FIG. 1. FIGS. 2B through 12B illustrate cross-sectional views (taken in directions I-I and II-II) of FIGS. 2A through 12A, respectively.

Figure 2A:
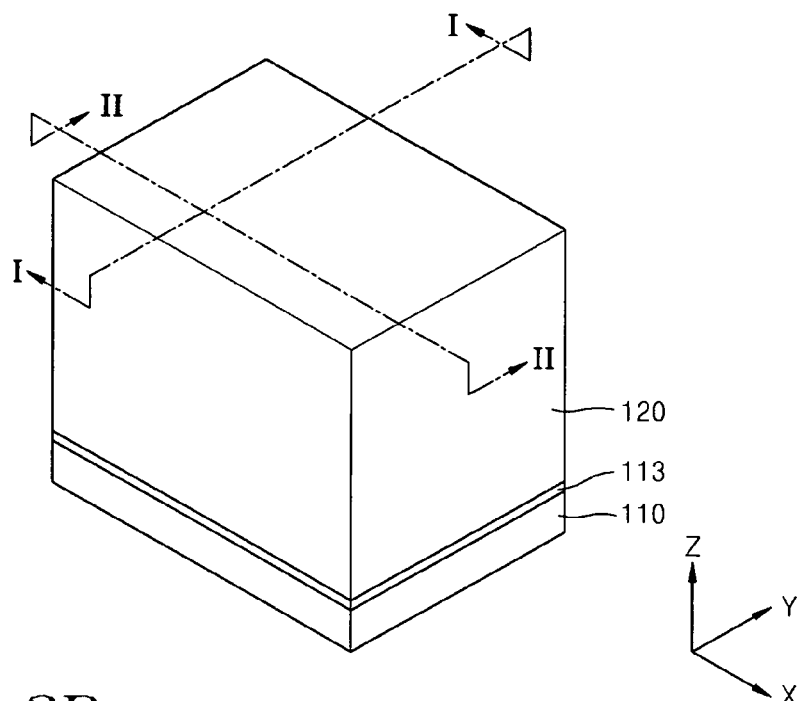
Figure 2B:
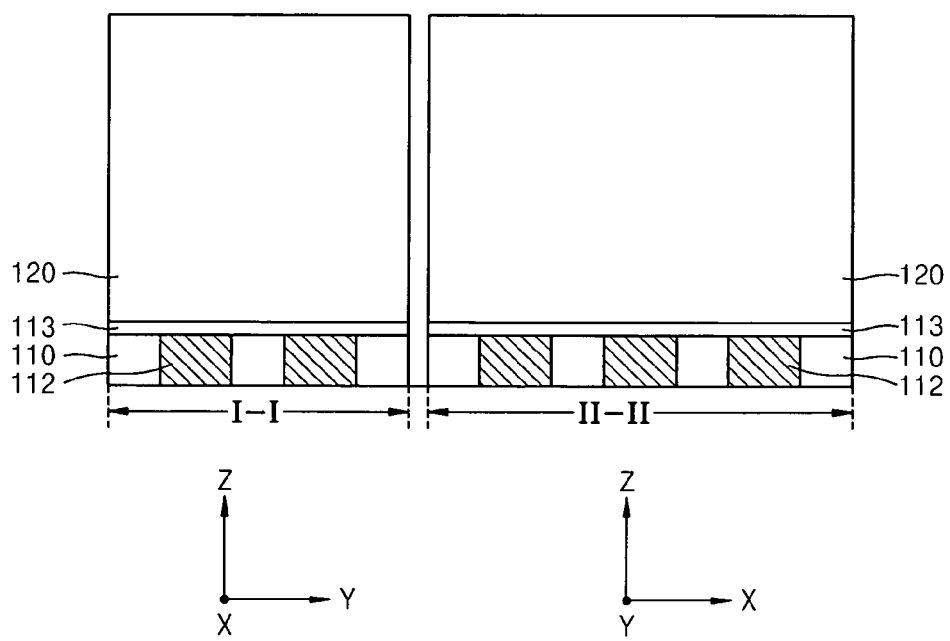

Referring to FIGS. 2A and 2B, an etch stop layer 113 and a mold layer 120 may be sequentially formed on an interlayer dielectric layer 110. The interlayer dielectric layer 110 may have storage node contacts 112 penetrating therethrough and connected to underlying features on a semiconductor substrate (not shown in FIGS. 2A and 2B). For example, a transistor having a gate electrode and source and drain regions may be formed under the interlayer dielectric layer 110. Each of the storage node contacts 112 may be electrically connected to one of the source and drain regions of the transistor, and a bit line may be formed in a direction crossing the gate electrode on the gate electrode of the transistor. The storage node contact 112 may be formed at a same level as the bit line.

The mold layer 120 may provide a mold for forming a pillar-type storage node electrode, as described in further detail below. The mold layer 120 may be formed of silicon oxide such as tetraethoxysilane (TEOS), a high-density plasma (HDP) oxide, phospho-silicate-glass (PSG), undoped-silicate-glass (USG), boro-phospho-silicate-glass (BPSG), spin-on-glass (SOG), etc. The etch stop layer 113 may function to prevent the interlayer dielectric layer 110 disposed under the mold layer 120 from being etched during a subsequent process of etching the mold layer 120. The etch stop layer 113 may be formed of a material, e.g., silicon nitride, having an etch selectivity with respect to the mold layer 120.

Figure 3A:
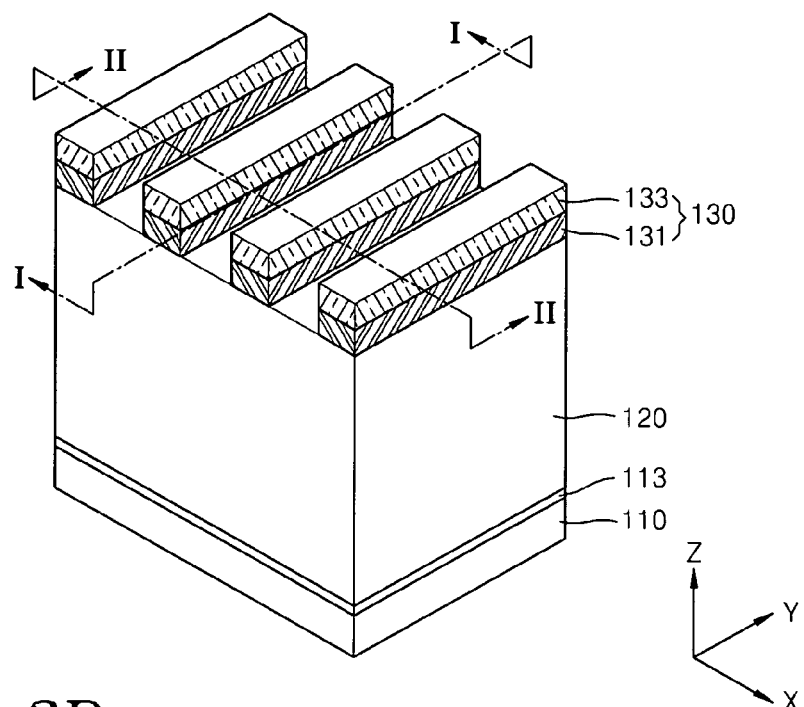
Figure 3B:
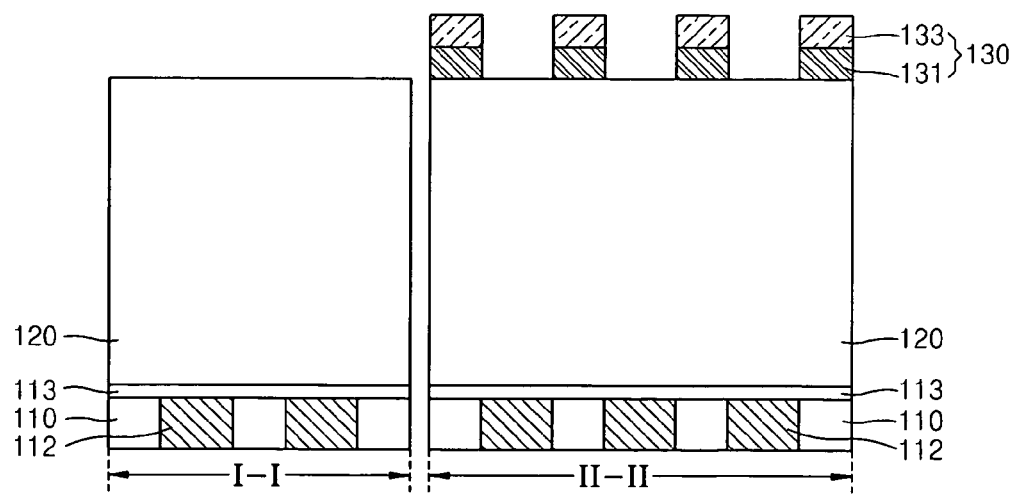

Referring to FIGS. 3A and 3B, a support pattern 131 and a support mask pattern 133 may be sequentially formed on the mold layer 120, e.g., by depositing and patterning respective layers using photolithography and etching processes, thereby forming a support structure 130 having the support pattern 131 and the support mask pattern 133. The support pattern 131 may serve to support subsequently-formed storage node electrodes and may prevent the storage node electrodes from collapsing.

The support pattern 131 may be formed of a material, e.g., silicon nitride, having an etch selectivity with respect to the mold layer 120. The support mask pattern 133 may be formed of a material, e.g., polysilicon (poly-Si) or tungsten (W), having an etch selectivity with respect to both the support pattern 131 and the mold layer 120. The support mask pattern 133 may serve as an etch mask and protect the support pattern 131 during a subsequent process of etching the mold layer 120. However, the support mask pattern 133 may be omitted, e.g., if the support pattern 131 itself is used as an etch mask during the etching of the mold layer 120. A buffer layer (not shown) may be formed between the support pattern 131 and the support mask pattern 133. The buffer layer may be, e.g., a silicon oxide layer. The support pattern 131 may have a line shape that extends in the same direction as the bit line. For example, the support pattern 131 may overlap the bit line and extend in the same direction as the bit line.

Figure 4A:
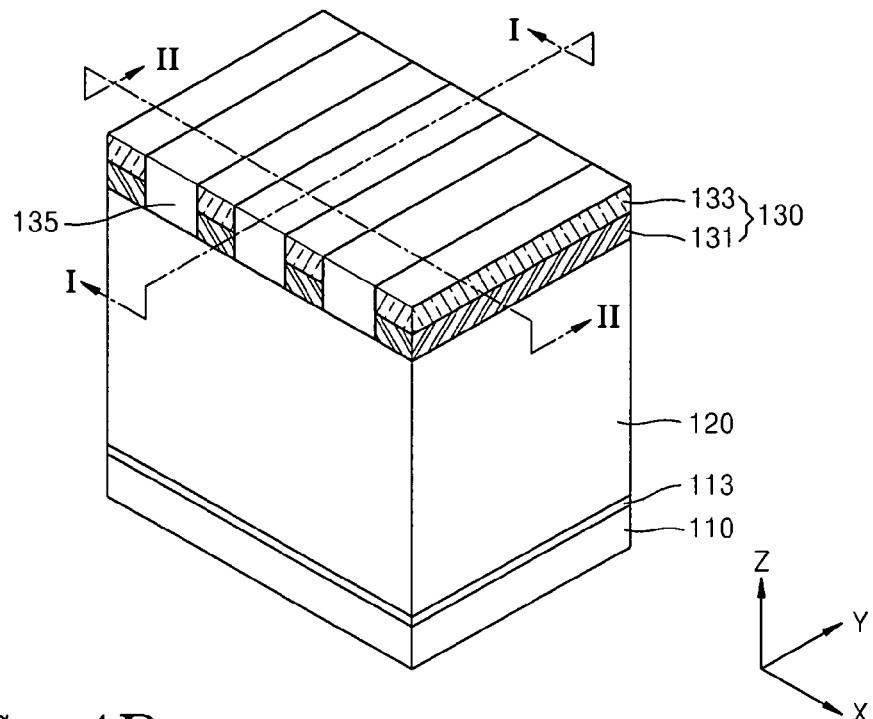
Figure 4B:
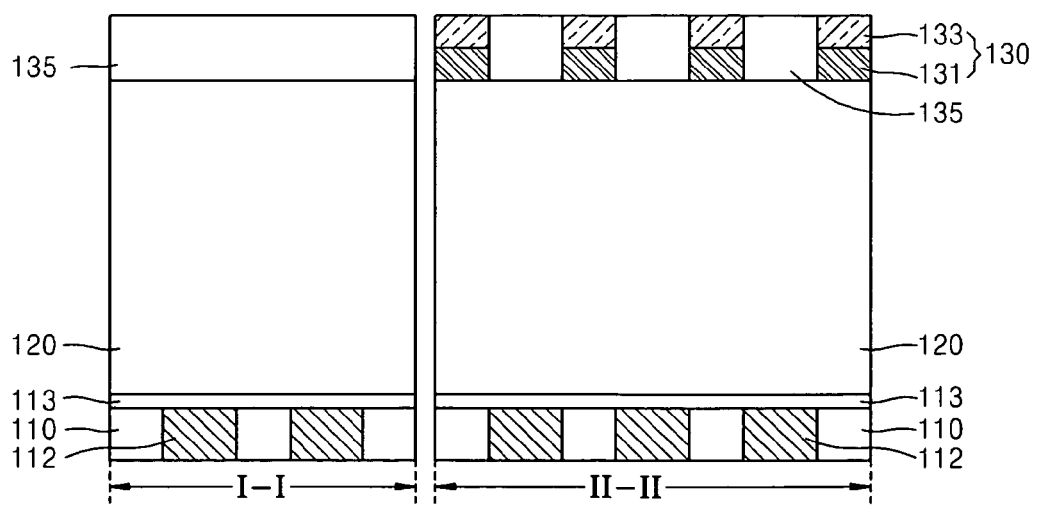

Referring to FIGS. 4A and 4B, a first sacrificial layer 135 may be formed between the support structures 130, i.e., between the support patterns 131 and the support mask patterns 133. To form the first sacrificial layer 135, gaps between the adjacent support structures 130 may be filled with a layer, e.g., a silicon oxide layer such as an HDP oxide layer, having an etch selectivity with respect to the support pattern 131 and the support mask pattern 133. Then, the silicon oxide layer may be planarized by, e.g., an etchback process or a chemical mechanical polishing (CMP) process, using the support mask pattern 133 as a stop layer, thereby forming the first sacrificial layer 135.

Figure 5A:
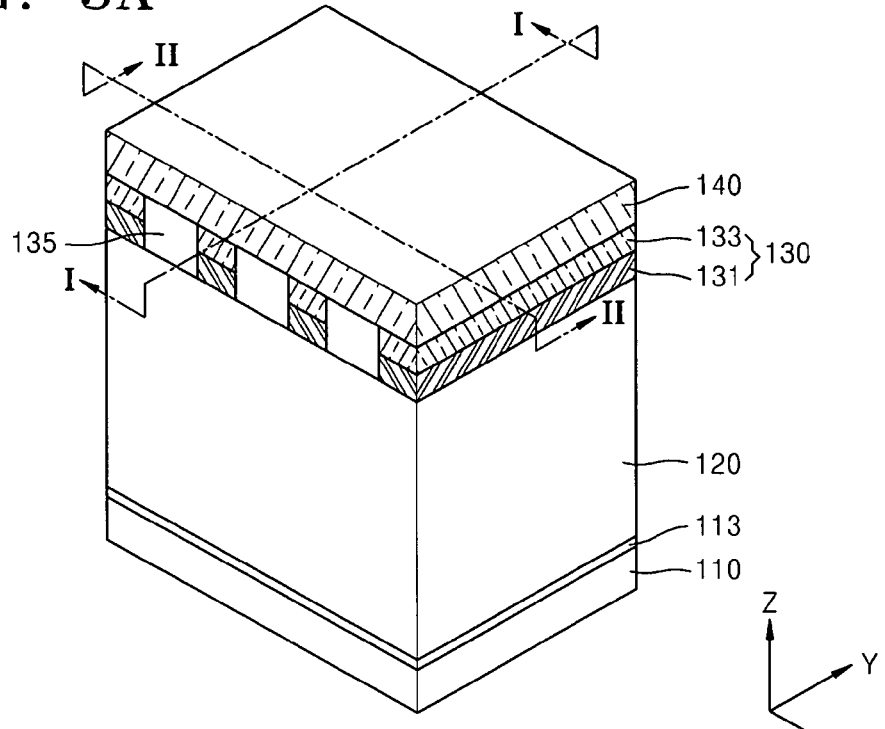
Figure 5B:
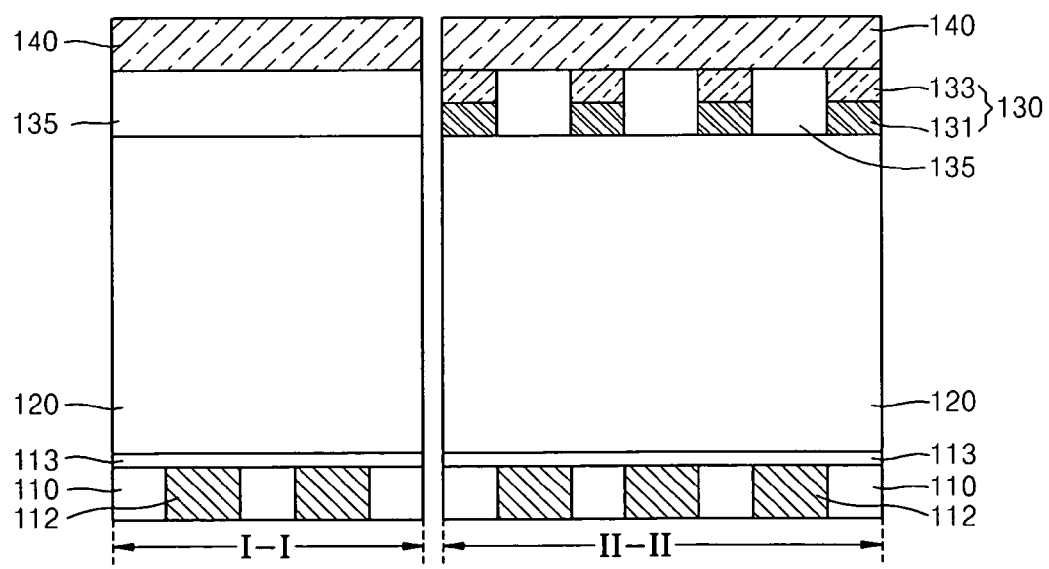

Referring to FIGS. 5A and 5B, a first mask layer 140 may be formed on the support structure 130, i.e., on the support pattern 131 and the support mask pattern 133, and on the first sacrificial layer 135. The first mask layer 140 may be formed of a material having an etch selectivity with respect to the mold layer 120, the first sacrificial layer 135, and the support pattern 131. For example, the first mask layer 140 may be formed of the same material, e.g., poly-Si or W, as the support mask pattern 133.

Figure 6A:
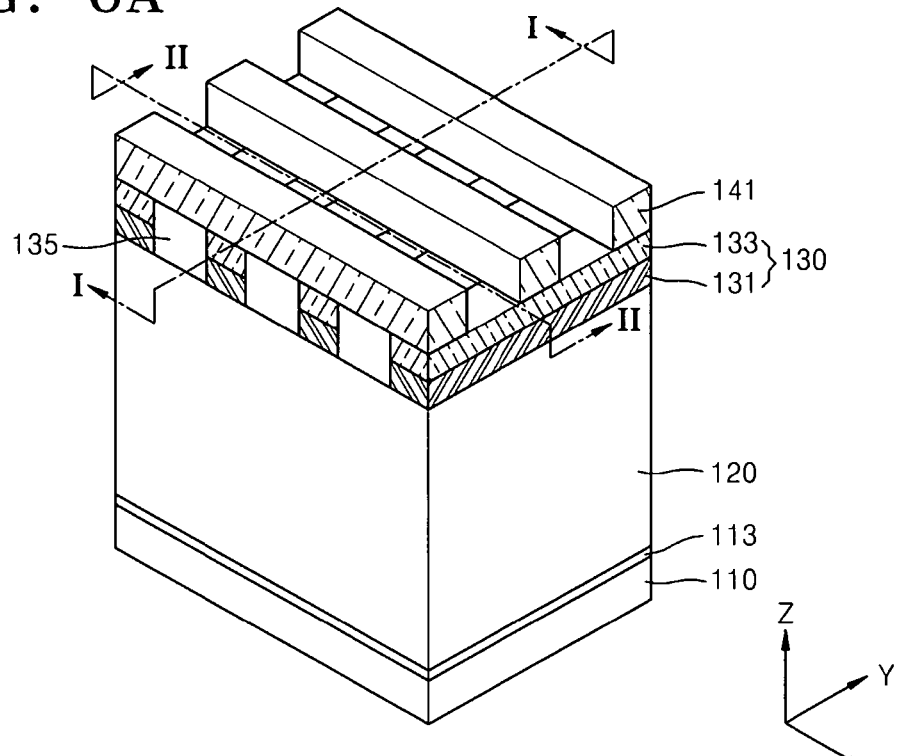
Figure 6B:
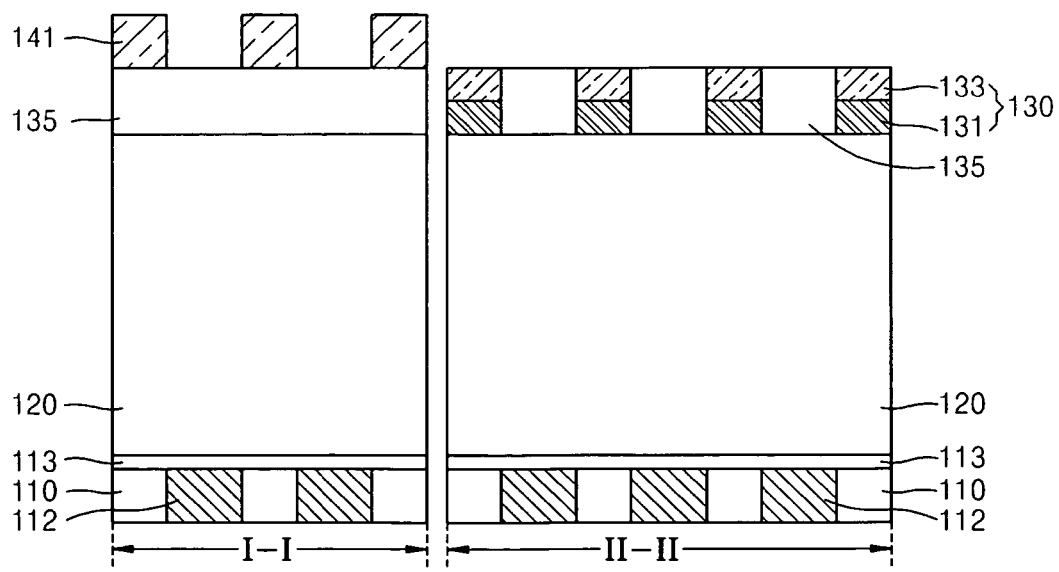

Referring to FIGS. 6A and 6B, the first mask layer 140 may be patterned to form a first mask pattern 141. The first mask pattern 141 may serve as a first pattern provided in connection with a self-aligned double patterning (SADP) process that is used, along with the support structure 130, to form a storage node electrode hole in the mold layer 120. The first mask pattern 141 may be formed as a line shape in a direction crossing the support structure 130, e.g., crossing at right angles. The first mask pattern 141 may be located between the storage node contacts 112 from the top plan view. For example, the first mask pattern 141 may overlap the word line and may extend in the same direction as the word line. The first mask pattern 141 may be formed by, e.g., depositing a layer and patterning the layer by forming trenches therein.

Figure 7A:
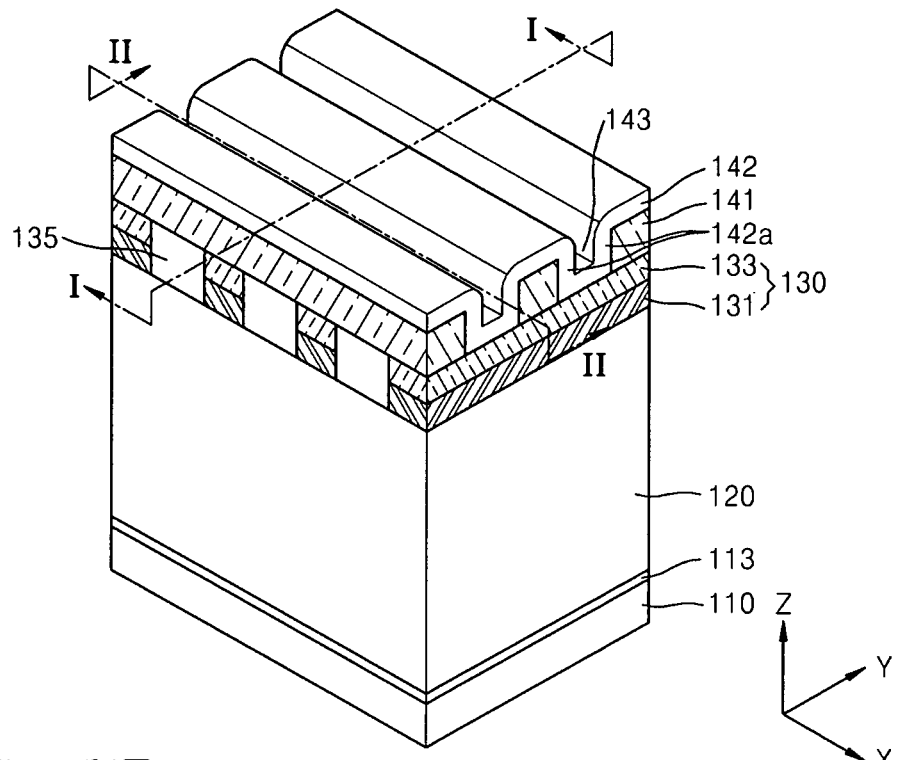
Figure 7B:
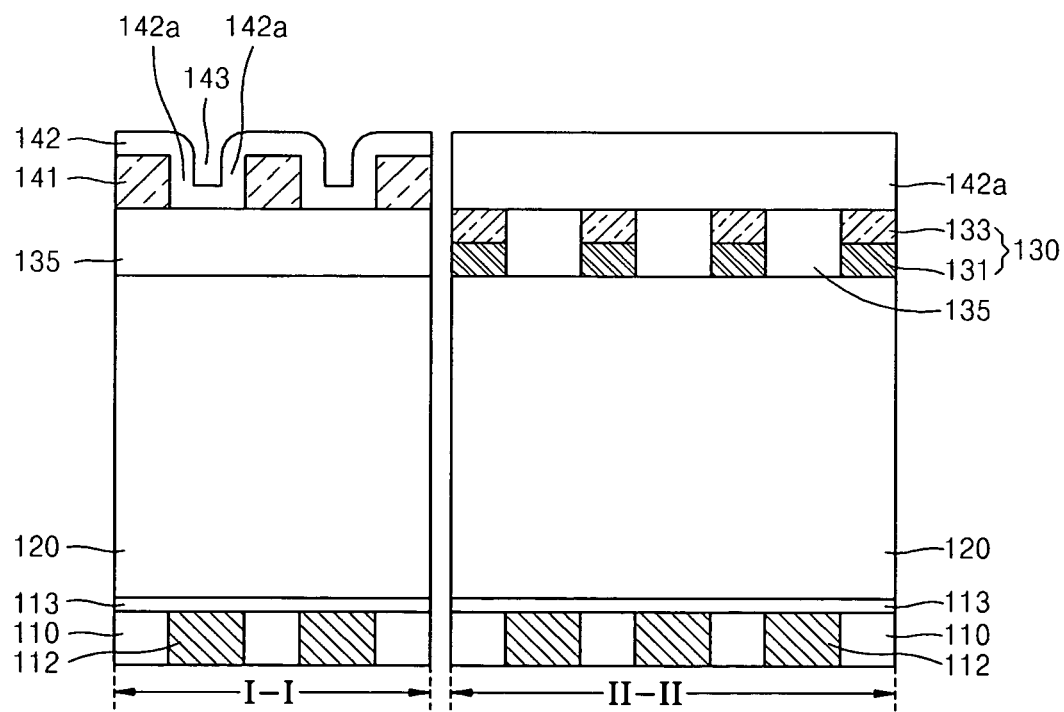

Referring to FIGS. 7A and 7B, a second sacrificial layer 142 may be formed with a uniform thickness to cover the first mask pattern 141, i.e., the second sacrificial layer 142 may be a conformal layer. For example, the thickness of sidewall portions 142a of the second sacrificial layer 142 on sidewalls of the first mask pattern 141 and covering a bottom of trenches 143 may be substantially the same. The trenches 143 may be between sidewall portions 142a of the second sacrificial layer 142, which are formed on opposite sidewalls of adjacent ones of the first mask patterns 141. The second sacrificial layer 142 may be formed of a material layer, e.g., a silicon oxide layer, having an etch selectivity with respect to the first mask pattern 141. To form the second sacrificial layer 142, a silicon oxide layer may be deposited using a conformal deposition process, e.g., a chemical vapor deposition (CVD) process or an atomic layer deposition (ALD) process. The thickness of the second sacrificial layer 142 may determine a first width, in the direction I-I, of a storage node electrode hole formed in a subsequent stage. A second width, in the direction II-II, of the storage node electrode hole may be determined by a distance between the adjacent support patterns 131.

Figure 8A:
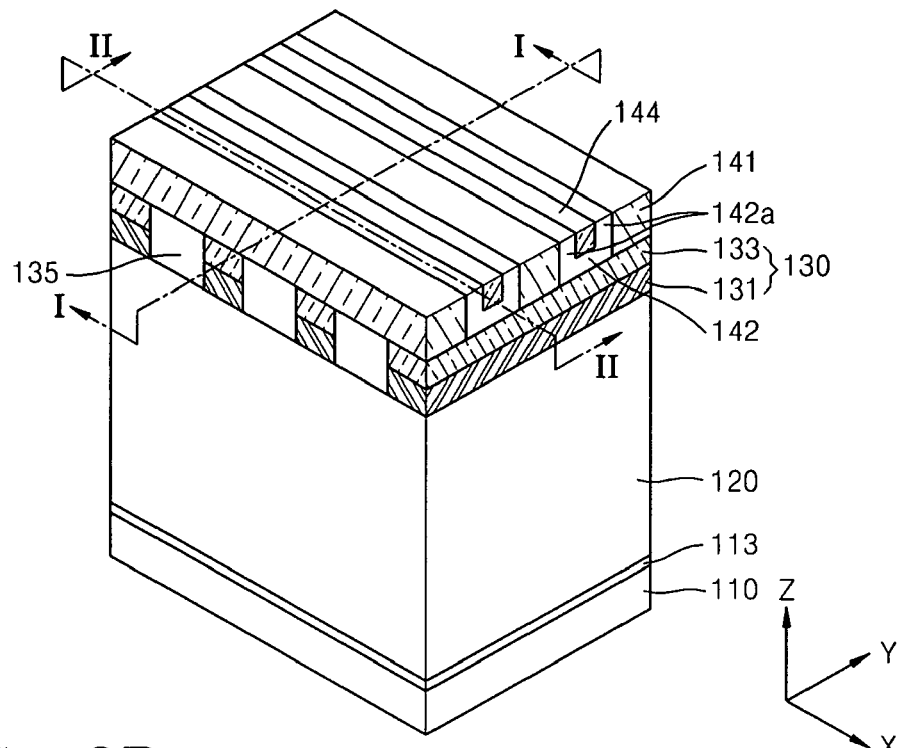
Figure 8B:
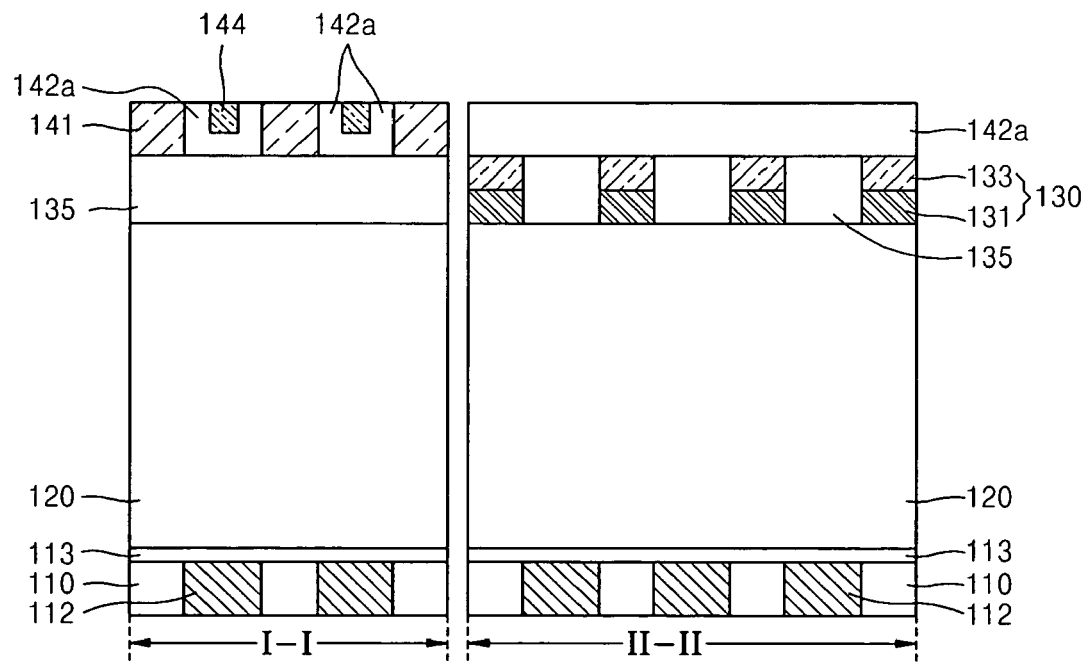

Referring to FIGS. 8A and 8B, a second mask layer may be formed to fill the trenches 143 of the second sacrificial layer 142. The second mask layer and the second sacrificial layer 142 may be planarized, e.g., by an etchback process or a CMP process, until a top surface of the first mask layer 141 is exposed. As a result, a second mask pattern 144 may be formed from the second mask layer in each of the trenches 143. In another implementation, the second mask layer 144 may be formed to fill the trenches 143 of the second sacrificial layer 142 and planarized, e.g., by an etchback process or a CMP process, until a top surface of the second sacrificial layer 142 is exposed. The second mask pattern 144 may be formed in each of the trenches 143. The second sacrificial layer 142 and the second mask pattern 144 may be formed by a self-aligned double patterning (SADP) process using the first mask pattern 141 as a primary pattern.

With the first mask pattern 141 located between the storage node contacts 112 from the top plan view, the sidewall patterns 142a of the second sacrificial layer 142 and the second mask pattern 144 interposed therebetween may overlap and correspond to the storage node contacts 112 from the top plan view.

Figure 9A:
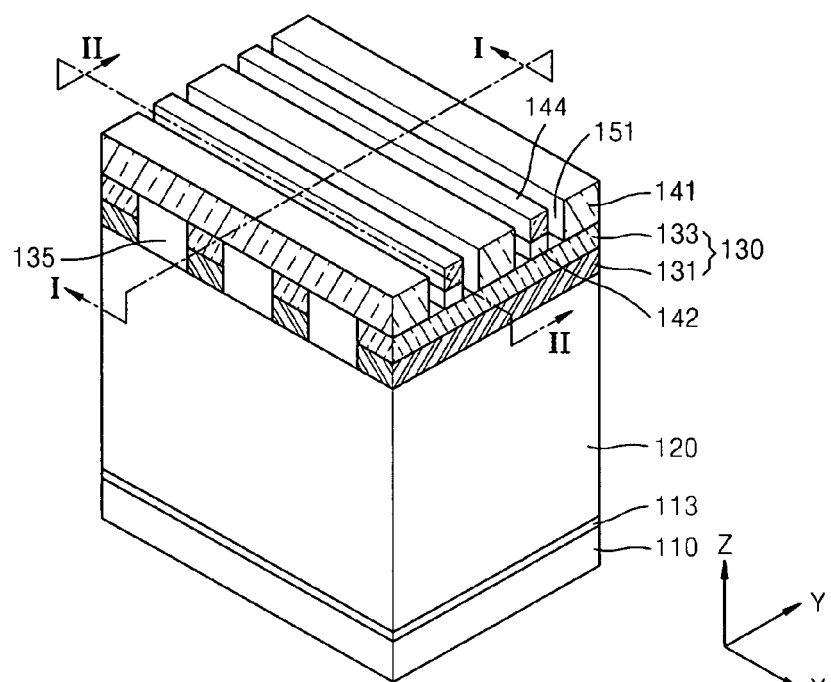
Figure 9B:
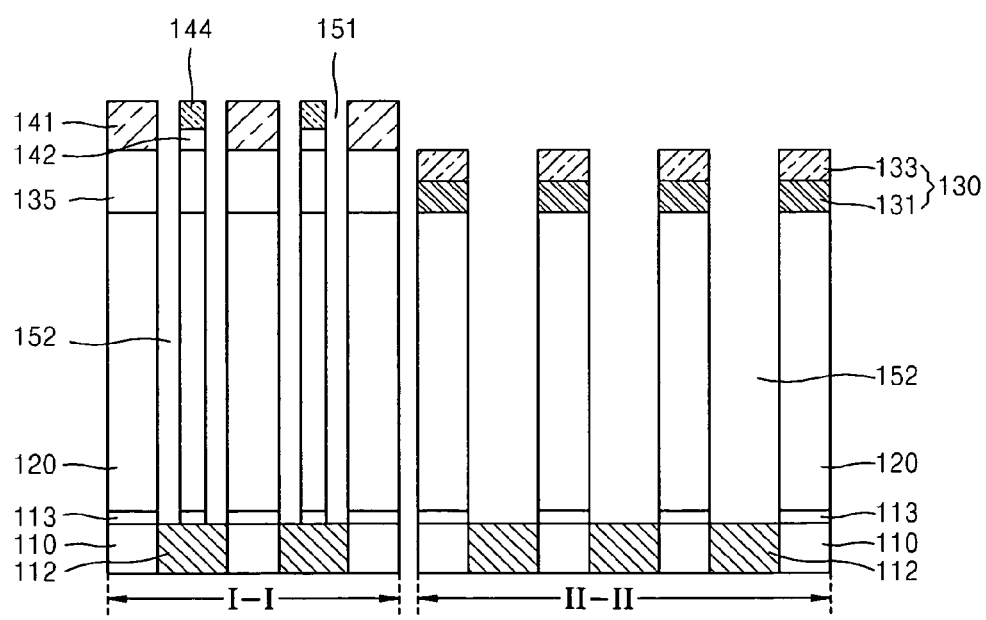

Referring to FIGS. 9A and 9B, the second sacrificial layer 142, the first sacrificial layer 135, and the mold layer 120 may be etched, e.g., by an anisotropic etching process, using the first and second mask patterns 141 and 144 as masks, thereby forming storage node electrode holes 152 exposing the storage node contacts 112. The formation of the storage node electrode holes 152 may include removing the sidewall patterns 142a of the second sacrificial layer 142 interposed between the first and second mask patterns 141 and 144 to form openings 151, and removing the first sacrificial layer 135 and the mold layer 120 disposed under the openings 151 to form the storage node electrode holes 152. In an implementation, the etch stop layer 113 may also be removed.

As described above, in forming the second mask pattern 144, only the second mask layer may be etched, e.g., using the etchback process or the CMP process, until the top surface of the second sacrificial layer 142 is exposed. During the formation of the storage node electrode holes 152 using the anisotropic etching process, removing the second sacrificial layer 142 disposed on the first mask pattern 141 may be followed by removing the exposed sidewall patterns 142a of the second sacrificial layer 142 interposed between the first and second mask patterns 141 and 144, thereby forming the openings 151. Thereafter, the first sacrificial layer 135 and the mold layer 120 disposed under the openings 151 may be removed using the first and second mask patterns 141 and 144 as masks, thereby forming the storage node electrode holes 152.

The storage node electrode holes 152 may be formed in spaces between the line-shaped support structures 130 (which may be arranged in, i.e., extend in, a first direction I-I) and the line-shaped mask patterns 141 and 144 (which may be arranged in, i.e., extend in, a second direction II-II crossing the first direction I-I). Thus, they may be separately formed in respective cells. Accordingly, the support structures 130 having the support patterns 131, in combination with the mask patterns 141 and 144, may node-separate the storage node electrode holes 152 in the respective cells. Further, the support mask pattern 133 disposed on the support pattern 131 may function as an etch mask and protect the support pattern 131 during the etching of the mold layer 120.

Figure 10A:
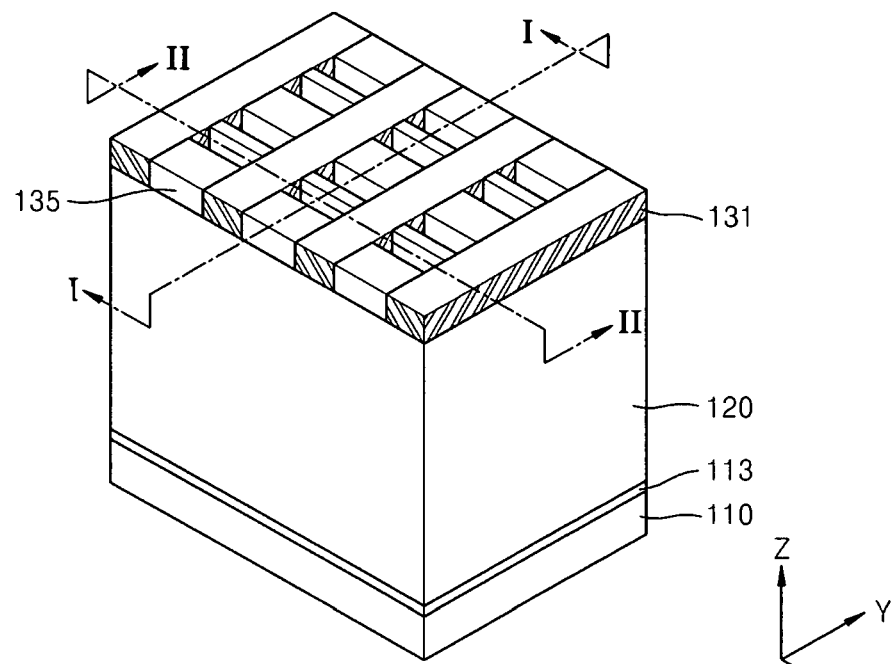
Figure 10B:
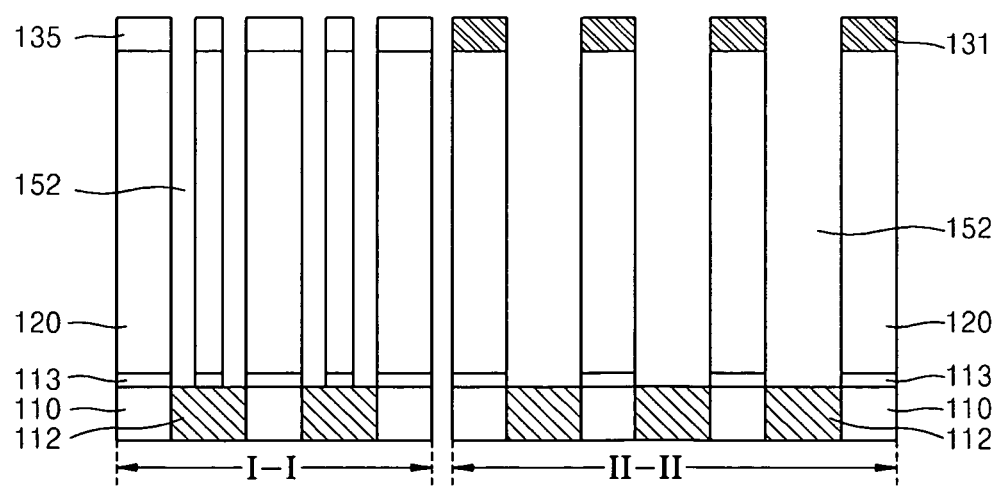

Referring to FIGS. 10A and 10B, after the storage node electrode holes 152 are formed, the first mask pattern 141, the second mask pattern 144, and the support mask pattern 133 may be removed. If the buffer layer is used between the support pattern 131 and the support mask pattern 133, the buffer layer may also be removed. The first mask pattern 141, the second mask pattern 144, and the support mask pattern 133 may be removed, e.g., by an etchback process or a CMP process, using the support pattern 131 as a stop layer. During the etching process, a portion of the first sacrificial layer 135 remaining between the support mask patterns 133 may also be removed. As a result, top surfaces of the support pattern 131 and the first sacrificial layer 135 formed at the same layer as the support pattern 131 may be exposed.

Figure 11A:
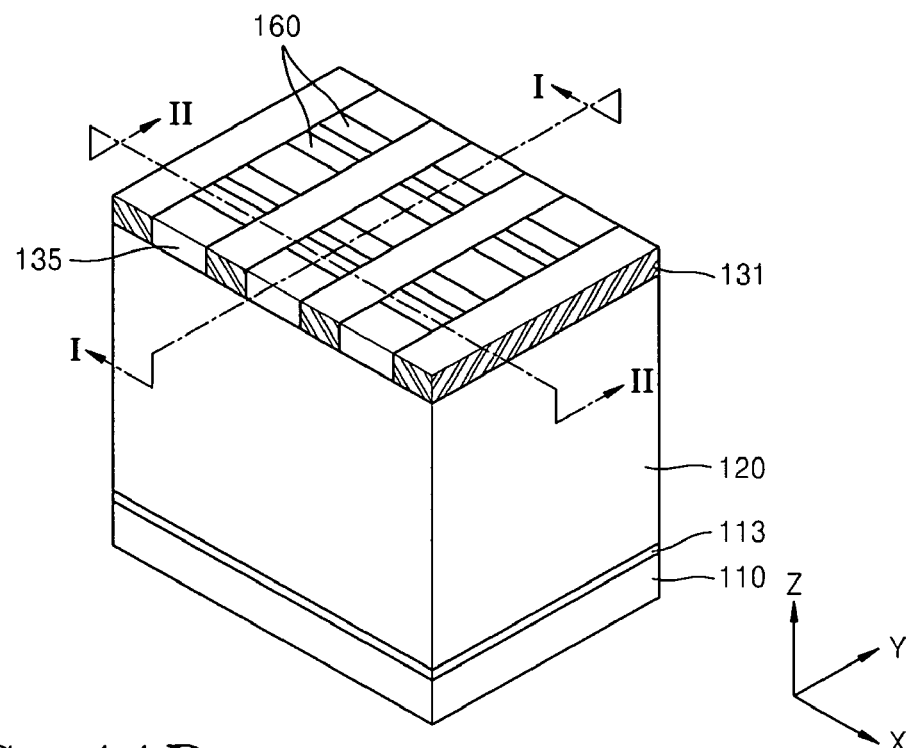
Figure 11B:
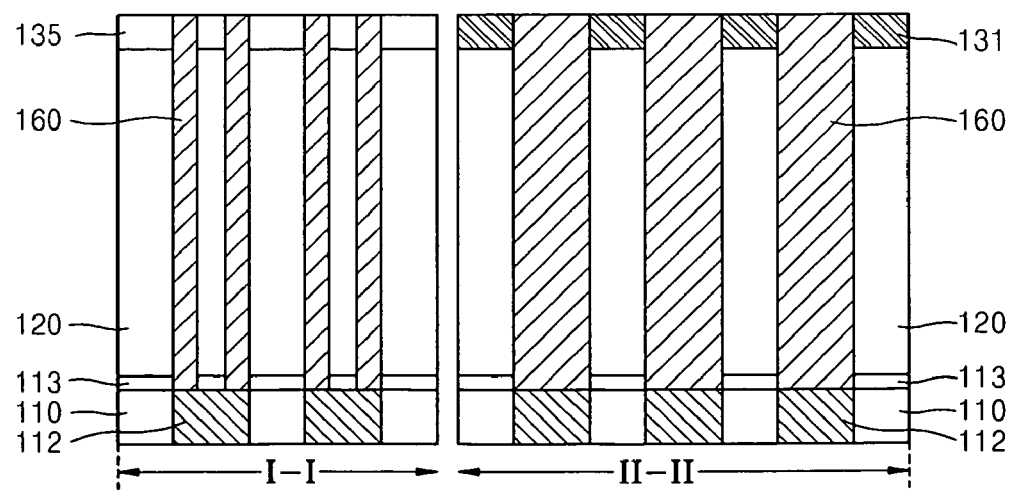

Referring to FIGS. 11A and 11B, a conductive layer may be formed to fill the storage node electrode holes 152 and then planarized, e.g., by an etchback process or a CMP process, using the support pattern 131 or the first sacrificial layer 135 as a stop layer, to form pillar-type storage node electrodes 160. The conductive layer 160 may be, e.g., a conductive poly-Si layer or a metal layer. For example, the metal layer may be formed of a noble metal such as platinum (Pt), ruthenium (Ru), and iridium (Ir), etc.; a conductive oxide of the noble metal, e.g., $RuO_2$, $IrO_2$, etc.; a refractory metal such as titanium (Ti), tungsten (W), tantalum (Ta), etc.; a conductive nitride of the refractory metal, e.g., TiN, TaN, WN, etc; or combinations of such materials.

Figure 12B:
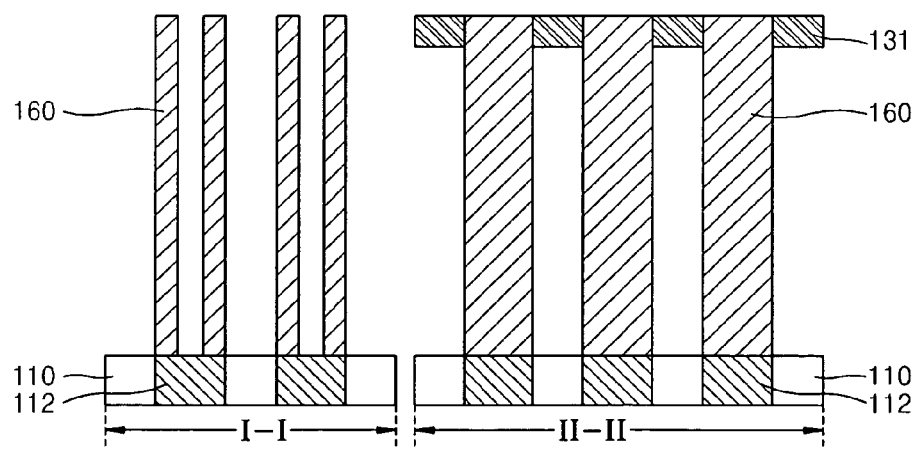

Referring to FIGS. 12A and 12B, the first sacrificial layer 135 and the mold layer 120 may be removed, e.g., by anisotropic etching, to leave the storage node electrodes 160 and the support patterns 131. For example, the anisotropic etching process may be performed using an etchant containing water, ammonium fluoride, and fluoric acid. The etchant may selectively remove silicon oxide used to form the first sacrificial layer 135 and the mold layer 120. The etch stop layer 113 remaining under the mold layer 120 may inhibit the etching of the underlying interlayer dielectric layer 110.

After the first sacrificial layer 135 and the mold layer 120 are removed, the pillar-type storage node electrodes 160 may be supported to extend in a vertical direction by the support patterns 131. The support patterns 131 may remain and may extend in a horizontal direction between the storage node electrodes 160. The support patterns 131 may be spaced apart from the interlayer dielectric layer 110, and may have upper surfaces that are substantially co-planar with upper surfaces of the storage node electrodes 160. The pillar-type storage node electrodes 160 having a high aspect ratio, i.e., narrow sectional area and relatively greater height, may be stably supported by the support patterns 131 having a horizontal beam shape, without the storage node electrodes 160 contacting adjacent storage node electrodes 160 and/or falling down.

Figure 12C:
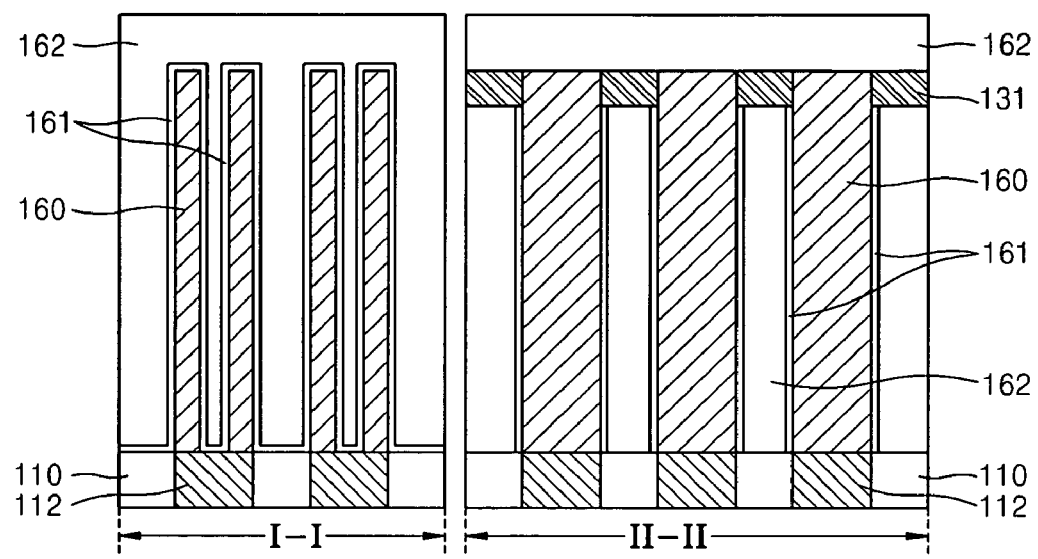
FIG. 12C illustrates cross-sectional views corresponding to FIG. 12B, and showing a dielectric layer and an upper electrode layer.

Subsequently, as shown in FIG. 12C, a dielectric layer 161 and an upper electrode layer 162 may be sequentially formed on the storage node electrodes 160. The upper electrode layer 162 may be electrically connected by contacts to interconnection lines formed on the upper electrode layer 162. The upper electrode layer 162 may be further processed to form respective upper electrodes.

As shown in FIGS. 1 and 12A, two pillar-type storage node electrodes 160 may be in contact with a single storage node contact 112. Thus, two capacitors may be connected in parallel in a single cell. As compared with a case where a single pillar-type storage node electrode is used, the footprint of a capacitor may be increased using the two pillar-type storage node electrodes 160. As a result, the total capacitance of each cell may increase.

As the design rule of a memory device is reduced, a footprint occupied by a capacitor on a substrate may also be reduced. Such reductions in footprint area may make it difficult to fill the typical cylindrical structures with a dielectric material and an upper electrode material. In particular, with a reduction in the design rule, patterns of a cylindrical capacitor may become narrower and higher, i.e., the aspect ratio may increase. As a result, conformally forming a dielectric layer and an upper electrode layer in a cylindrical lower electrode layer becomes progressively more difficult. Further, leakage current may increase, resulting in, e.g., poor data retention in a capacitive storage type memory such as DRAM, and photolithographic limits may hinder patterning of the cylindrical capacitor.

In contrast, the pillar-type storage node electrodes described above may be easier to fill. Furthermore, limitations on exposure limit may be overcome by using the self-aligned double patterning (SADP) process. Accordingly, the storage node electrodes 160 may be separately formed in respective cells using the support patterns 131.

Figure 13:
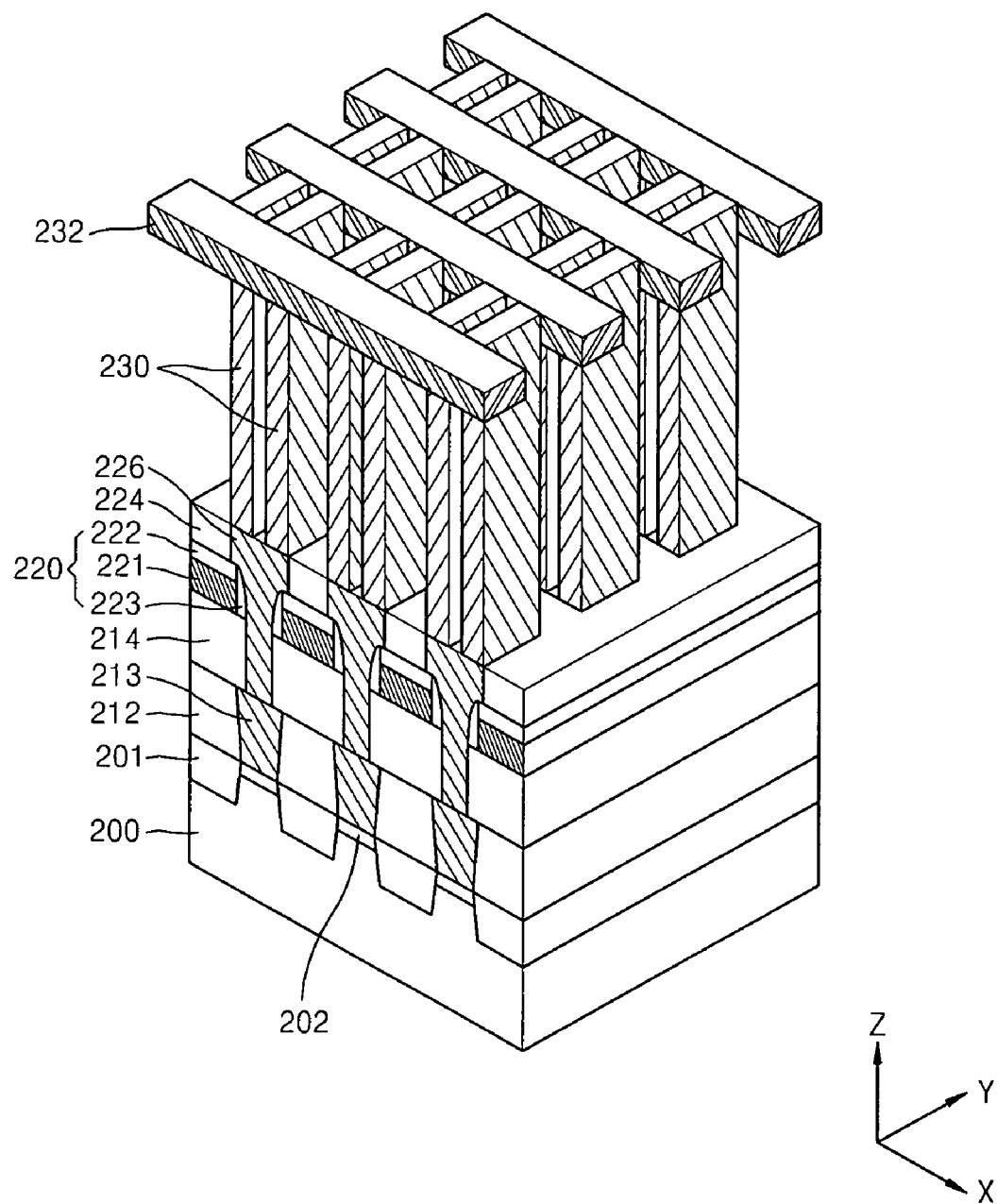
FIG. 13 illustrates a perspective view of a semiconductor memory device according to a second embodiment.
Figure 14:
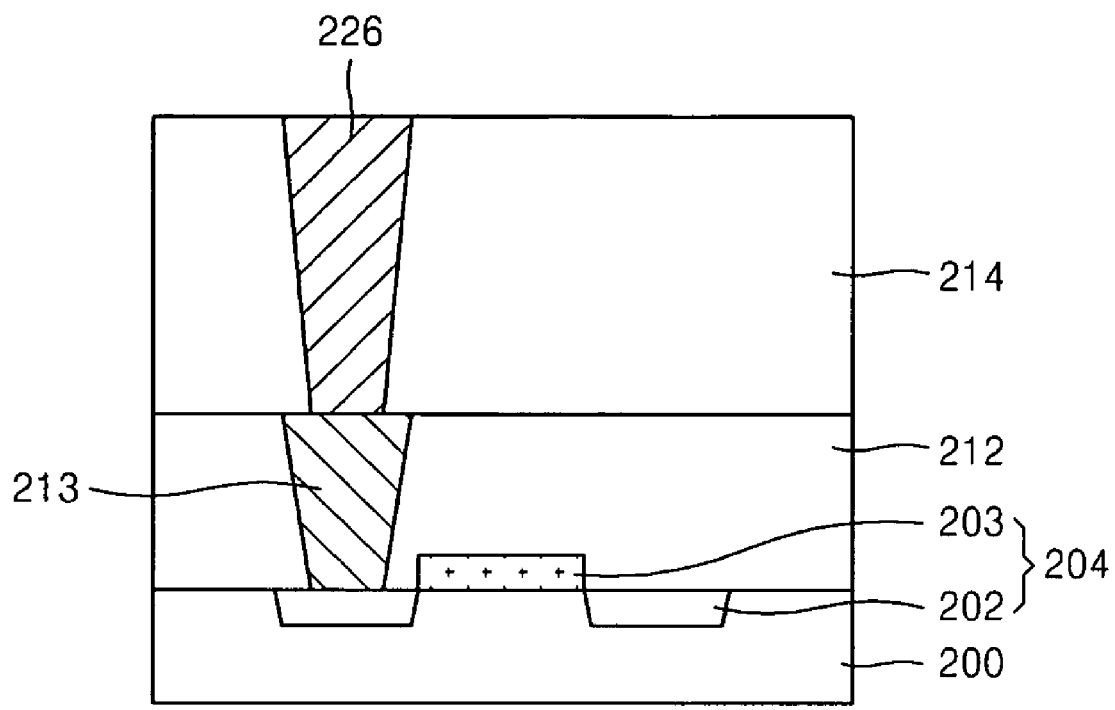
FIG. 14 illustrates a cross-sectional view showing details of a transistor structure of FIG. 13.

FIG. 13 illustrates a perspective view of a semiconductor memory device in which a capacitor is formed on a semiconductor substrate having an underlying structure with a transistor and a bit line according to an exemplary embodiment. In FIG. 13, a front section is taken in a direction vertical to a lengthwise direction of the bit line. FIG. 14 illustrates a cross-sectional view showing details of a transistor structure of FIG. 13.

Referring to FIG. 13, an active region may be defined by a device isolation layer 201 formed in a semiconductor substrate 200. Source and drain regions 202 may be formed in the active region. As shown in FIG. 14, a gate structure 203 may be disposed to control a channel region between the source and drain regions 202, the source and drain regions 202 and the gate structure 203 forming a transistor 204. In a left section of FIG. 13, although the device isolation layer 201 is illustrated as being parallel to a bit line 221 for brevity, it may have various other shapes according to the type of the active region. A contact pad 213 may be formed in a first interlayer dielectric layer 212 to contact the source and drain regions 202. Although not shown in FIG. 13, word line structures may extend in a direction vertical to the bit line 221 in front of and behind the contact pad 213.

A bit line structure 220 may be formed on a second interlayer dielectric layer 214. The bit line structure 220 may include the bit line 221, a bit line mask layer 222 disposed on the bit line 221, and bit line spacers 223 disposed on sidewalls of the bit line 221 and the bit line mask layer 222. The bit line mask layer 222 and the bit line spacers 223 may protect the bit line 221 during a subsequent process of etching a third interlayer dielectric layer 224 to form storage node contact holes.

A storage node contact 226 may be in contact with the contact pad 213 through the third interlayer dielectric layer 224 and the second interlayer dielectric layer 214. A portion of the contact pad 213, which is not shown in FIG. 13, may be connected to a bit line contact (not shown). A storage node electrode 230 may be formed as a pillar type on the storage node contact 226. A support pattern 232 may extend in the same direction as the bit line 221 between the storage node electrodes 230, and may node-separate and support the storage node electrodes 230. Here, two storage node electrodes 230 may be separately formed on each of the storage node contacts 226.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor memory device, the method comprising:

forming an interlayer dielectric layer on a semiconductor substrate;

forming storage node contacts that extend through the interlayer dielectric layer;

sequentially forming an etch stop layer and then a mold layer on the interlayer dielectric layer;

forming a plurality of line-shaped support structures and a first sacrificial layer filling gaps between the support structures on the mold layer, the support structures extending in a first direction;

sequentially forming a plurality of line-shaped first mask patterns, a second sacrificial layer, and then second mask patterns on the support structures and on the first sacrificial layer, the first mask patterns extending in a second direction crossing the first direction, the second sacrificial layer covering the first mask patterns to a uniform thickness, and the second mask patterns being formed in trenches in the second sacrificial layer between adjacent ones of the first mask patterns;

removing the second sacrificial layer, the first sacrificial layer, and the mold layer using the first mask patterns, the second mask patterns, and the support structures as masks to form storage node electrode holes that expose surfaces of the storage node contacts;

removing the first mask patterns and second mask patterns to expose the support structures;

filling the storage node electrode holes with a conductive material and etching back the conductive material to expose the support structures; and removing the first sacrificial layer and the mold layer to form pillar-type storage node electrodes supported by the support structures.

2. The method as claimed in claim 1, wherein:

a portion of the second sacrificial layer covers facing sidewalls of adjacent first mask patterns, and removing the second sacrificial layer, the first sacrificial layer, and the mold layer forms two storage node electrode holes that both expose a surface of a same storage node contact.

3. The method as claimed in claim 1, wherein:

each of the support structures includes a support pattern and a support mask pattern disposed on the support pattern, and removing the first and second mask patterns to expose the support structures includes removing the support mask pattern to expose the support pattern.

4. The method as claimed in claim 3, wherein:

the first mask pattern is formed of a material having an etch selectivity with respect to each of the support pattern, the first sacrificial layer, the second sacrificial layer, and the mold layer, and the second mask pattern is formed of a material having an etch selectivity with respect to each of the support pattern, the first sacrificial layer, the second sacrificial layer, and the mold layer.

5. The method as claimed in claim 1, wherein the support pattern is formed of a material having an etch selectivity with respect to each of the first sacrificial layer, the second sacrificial layer, and the mold layer.

6. The method as claimed in claim 1, wherein forming the second mask patterns includes:

forming a second mask layer on the semiconductor substrate, the second mask layer filling the trenches in the second sacrificial layer; and removing the second mask layer and the second sacrificial layer until the first mask layer is exposed.

7. The method as claimed in claim 1, wherein forming the second mask patterns includes:

forming a second mask layer on the semiconductor substrate, the second mask layer filling the trenches in the second sacrificial layer; and removing the second mask layer until the second sacrificial layer is exposed.

8. The method as claimed in claim 1, further comprising forming a transistor under the interlayer dielectric layer, the transistor having a gate electrode, a source region, and a drain region, wherein:

the storage node contact is formed to be electrically connected to one of the source region and the drain region of the transistor.

9. The method as claimed in claim 1, further comprising forming a bit line under the interlayer dielectric layer and extending parallel to the support structures.

10. The method as claimed in claim 1, further comprising sequentially forming a dielectric layer and then an upper electrode layer on the conductive material that fills the storage node electrode holes.

11. A method of forming a memory device, the method comprising:

forming a transistor on a semiconductor substrate, the transistor including a source/drain region electrically coupled to an overlying storage structure via a contact;

forming a first temporary layer covering the transistor;

forming first and second patterns at a same level on the first temporary layer, the first and second patterns being spaced apart from one another on the first temporary layer;

forming third and fourth patterns at a same level on the first and second patterns, the third and fourth patterns being spaced apart from one another and defining, in combination with the first and second patterns, an enclosed area above the contact;

forming a fifth pattern that divides the enclosed area into two portions;

forming a pair of storage node electrode holes in the divided enclosed area using an etch operation, the first through fifth patterns serving as etch masks during the etch operation;

forming storage node electrodes in the pair storage node electrode holes, such that each storage node electrode is electrically connected to a same source/drain region of the transistor via the contact; and removing the temporary layer and the third, fourth, and fifth patterns so as to leave the first and second patterns in contact with upper portions of the storage node electrodes, the first and second patterns reinforcing the upper portions of the storage node electrodes.

* * * * *